(12) United States Patent
Jaeger et al.

(10) Patent No.: US 8,274,657 B2
(45) Date of Patent: Sep. 25, 2012

(54) RADIATION DETECTOR

(75) Inventors: Arndt Jaeger, Regensburg (DE); Peter Stauss, Pettendorf (DE); Klaus Streubel, Laaber (DE); Werner Kuhlmann, Munich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 357 days.

(21) Appl. No.: 12/516,831

(22) PCT Filed: Nov. 29, 2007

(86) PCT No.: PCT/EP2007/063007
§ 371 (c)(1),
(2), (4) Date: Aug. 6, 2009

(87) PCT Pub. No.: WO2008/065170
PCT Pub. Date: Jun. 5, 2008

(65) Prior Publication Data
US 2010/0097609 A1    Apr. 22, 2010

(30) Foreign Application Priority Data

Nov. 30, 2006  (DE) .......................... 10 2006 056 579
Mar. 13, 2007  (DE) .......................... 10 2007 012 115

(51) Int. Cl.
*G01J 3/46* (2006.01)
(52) U.S. Cl. ..................................... 356/402; 356/411
(58) Field of Classification Search .................. 356/402, 356/416, 419, 425, 411; 250/214.1, 214 L, 250/214 R, 226, 339.01, 208.1, 338.4, 339.05–339.06, 250/339.02, 208.2; 257/431–434, 80–84, 257/21, 440, 443, 189; 327/514
See application file for complete search history.

(56) References Cited

U.S. PATENT DOCUMENTS 4,758,734 A    7/1988  Uchida et al.
5,362,969 A    11/1994 Glenn
(Continued)

FOREIGN PATENT DOCUMENTS
DE        29 20 773       12/1980
(Continued)

OTHER PUBLICATIONS

Preliminary Data Sheet MTCSiCT, "Integral True Colour Sensor—TO5 with IR blocking," 5 pages, Laser Components GmbH, Feb. 24, 2004.

(Continued)

*Primary Examiner* — Tri T Ton
(74) *Attorney, Agent, or Firm* — Slater & Matsil, L.L.P.

(57) ABSTRACT

A radiation detector is disclosed with a detector arrangement, which has a plurality of detector elements, by means of which a detector signal is obtained during operation of the radiation detector, and with a control device, wherein the detector elements each have a spectral sensitivity distribution, and are suited for generating signals, at least one detector element comprises a compound semiconductor material, and this detector element is designed for detecting radiation in the visible spectral region, the radiation detector is designed such that the sensitivity distributions of the detector elements are used to form different spectral sensitivity channels of the radiation detector, a channel signal assigned to the respective sensitivity channel can be generated in these sensitivity channels using the detector elements, and the control device is designed such that the contributions of different channel signals to the detector signal of the radiation detector are differently controlled.

22 Claims, 13 Drawing Sheets

U.S. PATENT DOCUMENTS

| | | | |
|---|---|---|---|
| 5,818,977 | A | 10/1998 | Tansley |
| 5,883,395 | A | 3/1999 | Krause |
| 5,926,282 | A | 7/1999 | Knobloch et al. |
| 6,307,660 | B1 | 10/2001 | Cordell et al. |
| 6,380,532 | B1 | 4/2002 | Christensen |
| 6,407,439 | B1 | 6/2002 | Hier et al. |
| 2004/0222359 | A1 | 11/2004 | Nixon et al. |
| 2005/0072908 | A1 | 4/2005 | Grunert et al. |
| 2006/0146326 | A1 | 7/2006 | Nagashima et al. |
| 2006/0193231 | A1 | 8/2006 | Mizuuchi et al. |
| 2007/0040101 | A1 | 2/2007 | Haas et al. |
| 2007/0241260 | A1 | 10/2007 | Jaeger et al. |
| 2008/0237633 | A1 | 10/2008 | Jaeger et al. |
| 2009/0294890 | A1* | 12/2009 | Graetzel et al. ............... 257/440 |

FOREIGN PATENT DOCUMENTS

| | | |
|---|---|---|
| DE | 40 24 011 A1 | 1/1992 |
| DE | 41 43 284 A1 | 10/1992 |
| DE | 101 01 457 A1 | 7/2002 |
| DE | 10 2004 037 020 A1 | 8/2005 |
| DE | 10 2005 001 280 A1 | 4/2006 |
| EP | 0 621 646 B1 | 7/1999 |
| EP | 1 521 069 A2 | 4/2005 |
| EP | 1 643 565 A2 | 4/2006 |
| GB | 2 381 950 A | 5/2003 |
| JP | 55-104725 A | 8/1980 |
| JP | 59-227171 A | 12/1984 |
| JP | 61-024270 A | 2/1986 |
| JP | 63-036121 A | 2/1988 |
| JP | 1-233328 A | 9/1989 |
| JP | 3-202732 A | 9/1991 |
| JP | 04-280678 A | 10/1992 |
| JP | 2000-066166 A | 3/2000 |
| TW | 498324 B | 8/2002 |
| TW | 499577 B | 8/2002 |
| WO | WO 97/12212 | 4/1997 |
| WO | WO 2006/128407 A1 | 12/2006 |

OTHER PUBLICATIONS

Taos Data SheetTCS230, "Programmable Color Light-to-Frequency Converter," pp. 1-10, Texas Advanced Optoelectronic Solutions Inc., 2006.

CIE 1931 color space, http://en.wikipedia.org/wiki/CIE_1931_color_space, 7 pages.

* cited by examiner

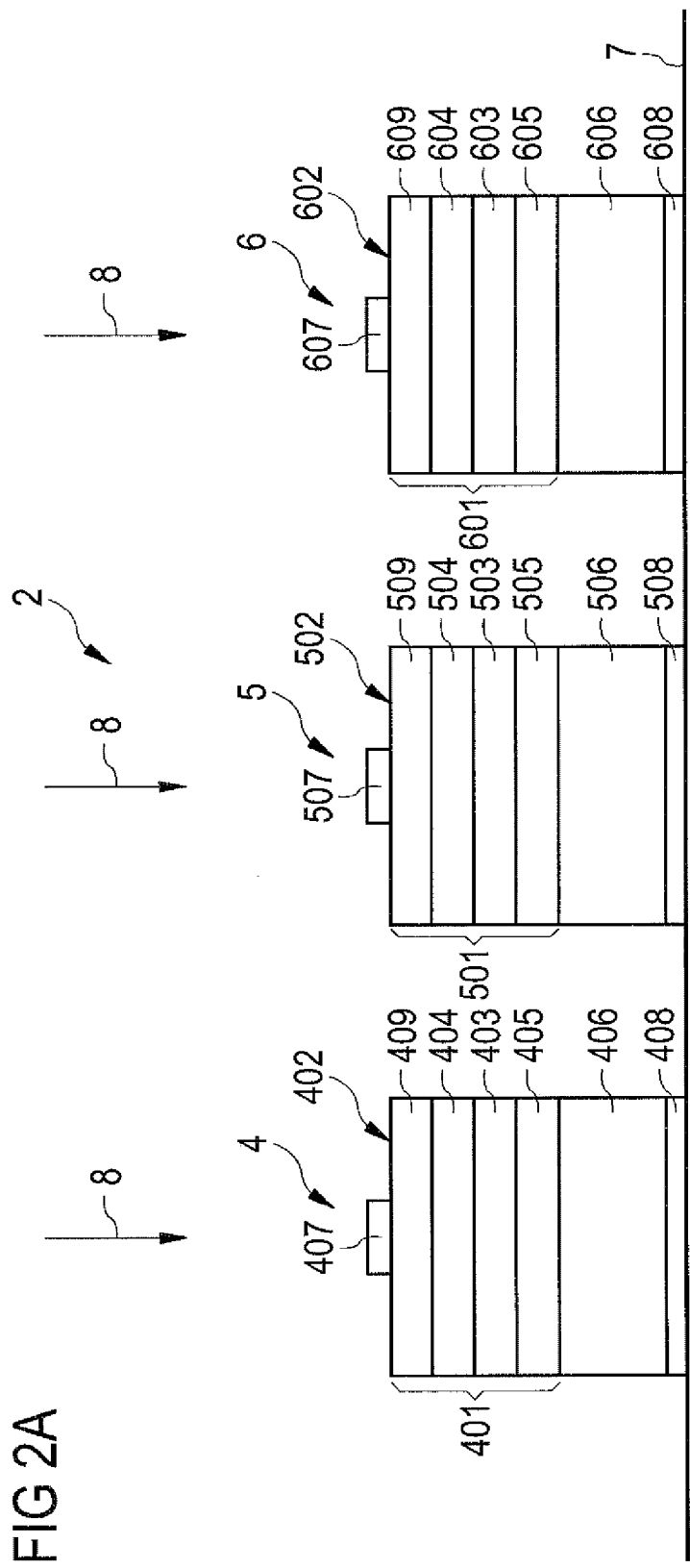

FIG 2B

| | material | D [nm] ≈ | $E_G$ [eV] ≈ | $\lambda_G$ [nm] ≈ | conducting type |
|---|---|---|---|---|---|
| contact layer 409, 509, 609 | GaP | 100 | 2,73 | 454 | p |
| active region 603 | $In_{0,5}(Ga_{0,8}Al_{0,2})_{0,5}P$ | 600 | 2,02 | 614 | intrinsic |
| active region 503 | $In_{0,5}(Ga_{0,5}Al_{0,5})_{0,5}P$ | 750 | 2,22 | 559 | intrinsic |
| active region 403 | $In_{0,5}(Ga_{0,2}Al_{0,8})_{0,5}P$ | 600 | 2,40 | 517 | intrinsic |
| barrier layer 404, 504, 604 | $In_{0,5}Al_{0,5}P$ | 300 | 2,52 | 492 | p |
| barrier layer 405, 505, 605 | $In_{0,5}Al_{0,5}P$ | 300 | 2,52 | 492 | n |

FIG 3B

| layer | material | D [nm] ≈ | E_G[eV] ≈ | λ_G [nm] ≈ | conducting type |
|---|---|---|---|---|---|
| 224 | $In_{0,5}Al_{0,5}P$ | 500 | 2,52 | 492 | n-type |
| 603 | $In_{0,5}(Ga_{0,8}Al_{0,2})_{0,5}P$ | 1000 | 2,02 | 614 | intrinsic |
| 223 | $In_{0,5}Al_{0,5}P$ | 300 | 2,52 | 492 | p-type |
| 222 | $In_{0,5}(Ga_{0,6}Al_{0,4})_{0,5}P$ | 200 | 2,15 | 577 | p-type |
| 221 | $Al_{0,5}Ga_{0,5}As$ | 200 | 2,00 | 620 | p-type |
| 220 | $In_{0,5}Al_{0,5}P$ | 300 | 2,52 | 492 | p-type |
| 503 | $In_{0,5}(Ga_{0,5}Al_{0,5})_{0,5}P$ | 1400 | 2,22 | 559 | intrinsic |
| 219 | $In_{0,5}Al_{0,5}P$ | 300 | 2,52 | 492 | n-type |
| 218 | $In_{0,5}(Ga_{0,35}Al_{0,65})_{0,5}P$ | 150 | 2,31 | 538 | n-type |
| 217 | $Al_{0,7}Ga_{0,3}As$ | 50 | 2,05 | 605 | n-type |
| 216 | $In_{0,5}Al_{0,5}P$ | 300 | 2,52 | 492 | n-type |
| 403 | $In_{0,5}(Ga_{0,2}Al_{0,8})_{0,5}P$ | 600 | 2,40 | 517 | intrinsic |
| 215 | $In_{0,5}Al_{0,5}P$ | 300 | 2,52 | 492 | p-type |
| 214 | GaP | 100 | 2,73 | 454 | p-type |

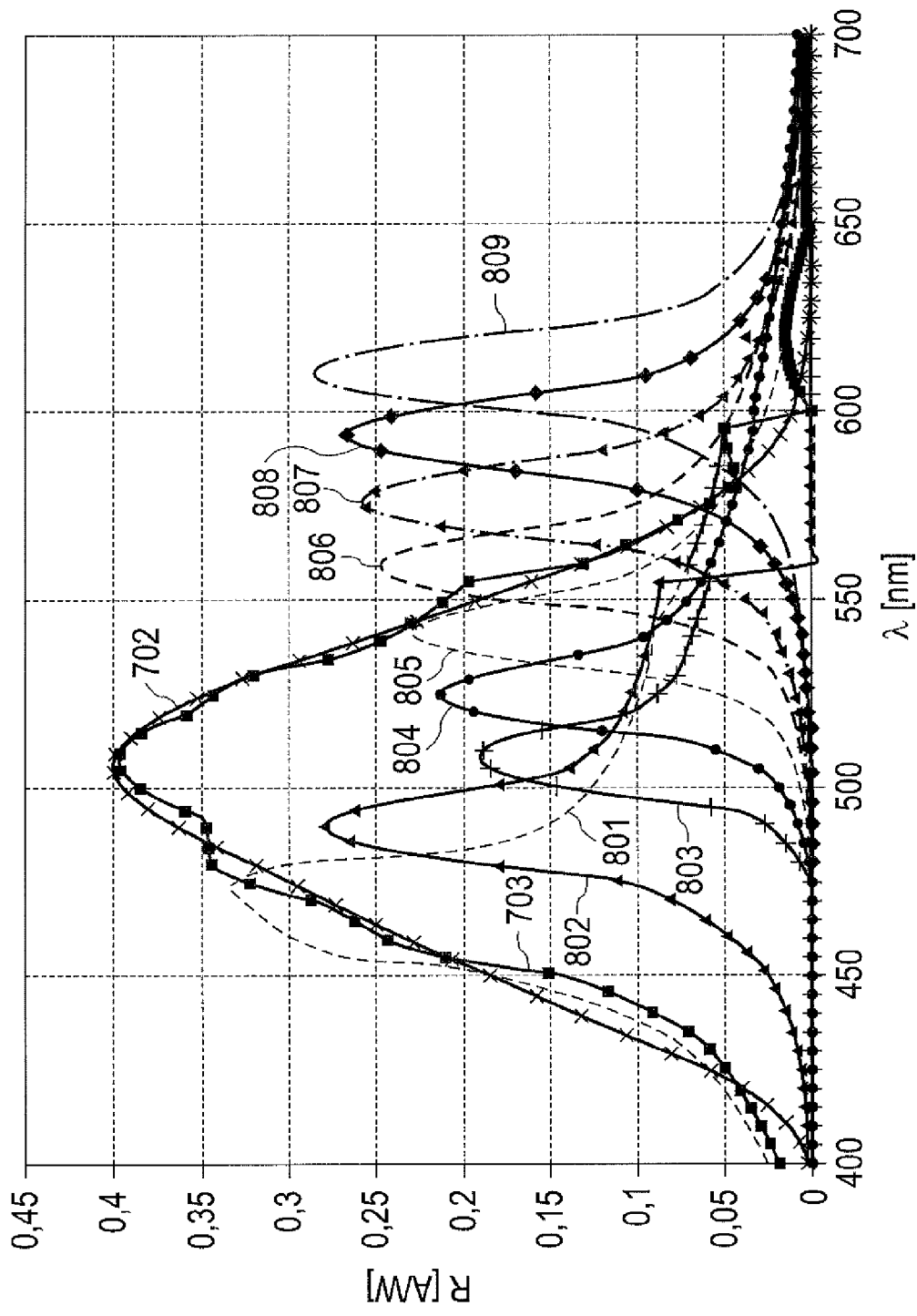

FIG 5B

| arrangement | active region (In$_{0,5}$(Al$_x$Ga$_{1-x}$)$_{0,5}$P) | | filter layer (GaP or (In$_{0,5}$(Al$_x$Ga$_{1-x}$)$_{0,5}$P) | | $\lambda_{max}$ [nm] | amplification factor of the respective arrangement for the multiplicity of the arrangement 703 |
|---|---|---|---|---|---|---|
| | Al-content x | thickness [nm] | material | thickness [nm] | | |
| 801 | 1,0 | 1000 | GaP | 1000 | 475 | 0,7 |
| 802 | 0,9 | 1000 | x=1,0 | 1000 | 490 | 0,75 |
| 803 | 0,8 | 1000 | x=0,9 | 1000 | 510 | 1,05 |
| 804 | 0,7 | 1000 | x=0,8 | 1000 | 525 | 0,5 |
| 805 | 0,6 | 1000 | x=0,7 | 1000 | 545 | 0 |
| 806 | 0,5 | 1000 | x=0,6 | 1000 | 560 | 0 |
| 807 | 0,4 | 1000 | x=0,5 | 1000 | 575 | -0,25 |
| 808 | 0,3 | 1000 | x=0,4 | 1000 | 595 | -0,12 |
| 809 | 0,2 | 1000 | x=0,3 | 1000 | 610 | 0 |

RADIATION DETECTOR

This patent application claims priority to German Patent Applications 10 2006 056 579.7 filed Nov. 30, 2006 and 10 2007 012 115.8 filed Mar. 13, 2007, whose complete disclosed content is hereby incorporated by reference into the present application.

TECHNICAL FIELD

The present invention relates to a radiation detector.

BACKGROUND

The problem addressed by the present invention is to specify a radiation detector that can be used for various applications.

SUMMARY

A radiation detector according to the invention comprises a detector arrangement that has a plurality of detector elements, by means of which a detector signal is obtained during operation of the radiation detector. Further, the radiation detector has a control device. The detector elements each have a spectral sensitivity distribution, and each are suited for signal generation. There, at least one detector element comprises a compound semiconductor material, said detector element being designed for detecting radiation in the visible spectral region. Furthermore, the radiation detector is designed such that different spectral sensitivity channels of the radiation detector are formed by means of the sensitivity distributions of the detector elements. In the sensitivity channels a channel signal, assigned to the respective sensitivity channel, can be generated by means of the detector elements. Furthermore, the control device is designed such that the contributions of the different channel signals to the detector signal of the radiation detector can be controlled differently, and preferably, are controlled differently.

Expediently, the control device is electrically connected to the detector arrangement. Thus, signals generated in the detector arrangement can be supplied to the control device in a simplified manner.

Compound semiconductor materials are particularly suited for the detection of radiation in the visible spectral region. This is particularly true when viewed in comparison to the elemental semiconductor material silicon. Silicon has a particularly high sensitivity in the infrared spectral region. When silicon is to be used for the detection of visible radiation, the infrared spectral component must be filtered out of the radiation incident on the detector by external filtering, which is expensive, in order to prevent infrared radiation components from contributing to the detector signal.

If, on the other hand, a compound semiconductor material is used for the detection, the compound semiconductor material can be simply selected such that it is comparatively insensitive in the infrared spectral region. Thus, the use of expensive external filters for long wave infrared radiation can be eliminated. Firstly, the space requirement, and secondly the production costs, are thus reduced because external filters, such as, e.g., interference filters can significantly increase the overall costs of radiation detectors.

III-V compound semiconductor materials are particularly suited for the detection of visible radiation, for example, with wavelengths between and including 420 nm and 700 nm, because they can have particularly high efficiency in the visible spectral region. Of the III-V compound semiconductor materials, a compound semiconductor material from the Iny Alx Ga1-x-y P material system with $0 \leq x \leq 1$ and $0 \leq y \leq 1$ is suitable, preferably with $x \neq 0$, $y \neq 0$, $x \neq 1$ and/or $y \neq 1$ in particular. By means of a compound semiconductor material from the (InAlGa)P material system, radiation can be detected over the entire visible spectral region. The band gap of a layer of this material system can be adjusted by varying the composition, and in particular, the selection of the Al content. Because InGaAlP is not particularly sensitive in the infrared spectral region, a long-wave cut-off wavelength of the spectral sensitivity distribution of the respective detector element, in particular, a cut-off wavelength in the visible spectral region, can be specified via the band gap alone. External filters are not necessary for this.

The spectral sensitivity distribution of a detector element is determined by the dependency of the strength of the signal generated in the respective detector elements, e.g., of the photocurrent or variables dependent on it, on the wavelength of the radiation incident on this detector element.

A predefined spectral distribution of the detector sensitivity, i.e., the spectral sensitivity distribution of the entire radiation detector, can be set by means of the control device. The sensitivity distribution of the entire radiation detector results from, for example, the dependency of an output signal of the radiation detector, which can be obtained after passing through the control device, on the wavelength of the incident radiation. Using varied control of the contributions of different channel signals to the overall detector signal, a predefined sensitivity distribution of the radiation detector can therefore be set using the control device.

Preferably, the relative weighting of contributions of different channel signals to the detector signal of the radiation detector is controlled by means of the control device. In particular, the control device can differently weight contributions of channel signals to the detector signal relative to each other. Owing to the different weighting of the contributions of channel signals to the overall detector signal, the predefined sensitivity distribution of the radiation detector can be set. In doing so, the respective channel signals, or the corresponding spectral distributions of the sensitivity channels, can be attenuated or amplified in a targeted manner by means of the control device.

Subsequently, the differently weighted channel signals can be superposed such that the detector signal responds according to the predefined distribution of the detector sensitivity. The detector signal of the radiation detector can be formed, in particular, by superposition, for example, by addition, of channel signals which are preferably weighted differently. A plurality of channel signals can contribute to the detector signal of the radiation detector. Preferably, the channel signals are superposed in the control device. Here, a channel signal that is not necessary for the desired detector sensitivity can be ignored. For example, a contribution of a channel signal to the detector signal can be suppressed in the control device for this purpose.

Using the control device therefore, different sensitivity distributions of the radiation detector can be realized by means of a prefabricated detector arrangement. The resulting detector sensitivity distribution then results from the different weighting of the individual sensitivity channels.

Particularly preferably, the number of different sensitivity channels of the radiation detector corresponds to the number of detector elements.

Preferably, different sensitivity channels have their respective sensitivity maximum at different wavelengths.

In a preferred embodiment, the control device has a plurality of inputs, via which signals generated in the detector elements can be supplied to the control device. Preferably, different inputs are assigned, in particular, each to different detector elements, or different sensitivity channels respectively. Particularly advantageously, one detector element, or respectively, one sensitivity channel is each assigned to one input.

In a further preferred embodiment, the control device has a plurality of control connections, by means of which contributions of channel signals to the detector signal can be controlled. Preferably the number of sensitivity channels corresponds to the number of control connections. The contributions of individual channel signals can be adjusted via the control connections, preferably independently of each other.

Using the control connections, for example, the amplification factors for the channel signals, by which the channel signals are accordingly amplified or attenuated relative to each other, can be set differently. For this, the control device expediently comprises an amplifier, in particular a controllable amplifier.

Preferably, the control device is designed such that the contributions of the channel signals to the detector signal are externally controllable. For this, the control connections are expediently implemented such that they can be externally controlled.

In a further preferred embodiment, the spectral distribution of the detector sensitivity can be adjusted during operation by means of the control device. Thus, a user can adjust the desired sensitivity distribution of the radiation detector using the control connections.

In a further preferred embodiment, sensitivity channels spectrally overlap. Preferably the sensitivity channels spectrally overlap in such a way that, owing to the overlapping channels, a spectral detection range of the radiation detector, preferably the visible spectral range, is covered. For this, the radiation detector expediently has a plurality of sensitivity channels in the visible spectral region.

For example, the radiation detector comprises a plurality of spectral sensitivity channels, which have a maximum spectral distribution at a wavelength in the visible spectral region.

Due to the plurality of sensitivity channels in the visible spectral range, the detector sensitivity can be shaped according to a predefined distribution in a simplified manner, by means of the control device.

In a preferred embodiment, the control device is designed such that the radiation detector can be operated, or is operated, as an ambient light sensor with a spectral distribution of the detector sensitivity according to that of the human eye. For this purpose, the sensitivity channels are expediently differently weighted by means of the control device such that a spectral sensitivity distribution according to that of the human eye results by superposing the differently weighted spectral sensitivity channels.

The sensitivity maximum of the light adapted human eye (photopic vision) lies at approximately 555 nm. The sensitivity maximum of the dark adapted human eye (scotopic vision) lies, in contrast, in a shorter wavelength region, at approximately 505 nm.

By means of the control device the sensitivity channels can be differently weighted such that the radiation detector, depending on the setting of the control device, has a spectral sensitivity distribution according to that of the light adapted or dark adapted human eye.

Preferably, the spectral distribution of the detector sensitivity is switchable, using the control device, between that of the light adapted human eye, and the darkness adapted human eye. The switching procedure can be controlled, for example, by means of a light/dark sensor, which the radiation detector preferably has.

In a further preferred embodiment, the radiation detector can be operated as a color sensor, in particular, for detecting three primary colors, e.g., red, green, and blue. In this embodiment, the radiation detector expediently has sensitivity channels which lie in the spectral range of the corresponding primary colors. Preferably, a separate sensitivity channel is assigned to each of the primary colors.

By attenuating the other color channels, e.g., by means of an amplification factor of 0 in the control device, which corresponds to a suppression of the respective channel signal contribution, the desired color can be detected in the remaining color channel. Using the detector signal, the color components in the radiation incident on the radiation detector can then be determined. From these color components, e.g., the chromaticity coordinate or the color impression of the incident radiation can be determined.

Preferably, the radiation detector can be operated by means of suitable control by the control device both as an ambient light sensor as well as a color sensor.

In a further preferred embodiment, the detector arrangement has a semiconductor body that comprises at least one of the detector elements. The semiconductor body can comprise a plurality of semiconductor layers, and can, in particular, be grown epitaxially. The semiconductor layers are expediently deposited on top of each other. Preferably, the detector element comprises an active region serving the signal generation. The active region is preferably disposed between two semiconductor layers of differing conducting types—p-conducting and n-conducting. These layers are preferably doped. Particularly preferably, the active region is implemented undoped (intrinsic). The detector element is designed preferably in the form of a diode structure, e.g., in the form of a pin diode structure. Pin diodes are characterized by advantageously low reaction times. The active region preferably comprises the compound semiconductor material. Particularly preferably, a plurality of detector elements, in particular the respective active region, comprises the compound semiconductor material, preferably, a material from the (InGaAl)P material system. Expediently, a plurality of detector elements designed for the visible spectral region comprises the compound semiconductor material.

In a preferred embodiment, a plurality of detector elements is monolithically integrated in a common semiconductor body. Preferably, this semiconductor body is grown epitaxially. The detector elements can be stacked, and in particular, disposed on top of each other. Such an arrangement of the detector elements has an advantageously low space requirement.

In a further preferred embodiment, the radiation detector comprises a plurality of separate detector elements, preferably disposed discretely and/or alongside each other. These elements can comprise, in each case, a separate semiconductor body with an active region. The individual detector elements are preferably designed as discrete detector chips. Compared to a monolithic, integrated implementation as described above, individual chips can be produced more simply. However, an arrangement with a plurality of discrete detector chips consumes more space compared to a monolithic construction.

In a further preferred embodiment, the radiation detector has three or more, preferably four or more, particularly preferably five or more sensitivity channels. These sensitivity channels can lie in the visible spectral range. The larger the number of different sensitivity channels, the more exactly a predefined sensitivity distribution of the radiation detector can be reproduced by means of the control device.

In a further preferred embodiment, the radiation detector has one or a plurality of narrow band sensitivity channels. A spectral width of a narrow band sensitivity channel (FWHM: full width at half maximum) can amount to 100 nm or less, preferably 60 nm or less, particularly preferably 40 nm or less, for example, 20 nm or less. By providing a narrow band sensitivity channel, the radiation detector can be simply used for the detection of precisely defined spectral lines. For example, a sensitivity channel can be designed such that it responds only to a specific spectral line. Thus, the radiation detector can be used, e.g., for authentication of objects that are characterized by this spectral line, such as for the identification of monetary bills or bank cards. This function can be provided in addition to the operation as a color sensor, or as an ambient light sensor.

In a further preferred embodiment, an individual channel signal is obtained by means of two signals generated in different detector elements. For example, a channel signal can be obtained by forming the difference of the signals generated in two different detector elements.

A spectral sensitivity channel on this basis can be obtained by forming the difference of the sensitivity distributions of two detector elements. Particularly preferably, the difference calculation is performed in the control device. The contribution of a channel signal obtained from the difference relative to the detector signal can subsequently also be controlled in the control device.

Processing of signals from different detector elements in this manner simplifies the design of the detector elements for a radiation detector with different sensitivity channels. A filtering stage for flattening the short-wave side of the spectral sensitivity distribution of the respective detector element can be eliminated for the formation of a sensitivity channel.

The distributions of two, preferably arbitrary, spectral sensitivity channels of the radiation detector expediently intersect at a value less than the maximum of one of the distributions, preferably less than the maxima of both distributions. Preferably, the long-wave edge of the distribution with the maximum at the shorter wavelength intersects the short-wave edge of the other distribution.

In a further preferred embodiment, one detector element, preferably a plurality of detector elements, comprises a filter layer. The filter layer absorbs radiation preferably in a wavelength range that comprises wavelengths which are shorter than the wavelength of a maximum of the spectral sensitivity distribution of this detector element. The short-wave edge of the sensitivity distribution of this detector element can be formed by means of the filter layer to obtain a delimited sensitivity channel. Preferably, the filter layer is integrated into the semiconductor body of the detector element. The filter layer can be grown epitaxially and/or can comprise a (III-V) compound semiconductor material.

The filter layer can further define a short wave cut-off wavelength of the respective sensitivity channel.

The formation of the sensitivity channel can accordingly be already effected during the manufacture of the detector elements. A subsequent processing of the signal, such as forming the difference as described above, is advantageously not required. However, the provision of an appropriate filter layer increases the production costs of the detector arrangement.

Preferably, the control device is implemented as an integrated circuit, e.g., based on silicon. Integrated circuits can be equipped with various functions, and in particular, can implement the amplification of the individual channel signals for differential weighting of the signal contributions, and also the formation of the difference for obtaining a sensitivity channel.

In a further preferred embodiment, the radiation detector has an electronic controller. This is preferably electrically connected to the control device, in particular, to its control connections. Furthermore, the controller is advantageously designed so that it is programmable. The adjustment of the control connections of the control device can be controlled by the controller. Using the controller therefore, the operating state of the radiation detector—e.g., as a color sensor, an ambient light sensor, or for detecting a predefined spectral line—can be programmably controlled. For example, switching the ambient light sensor from day sensitivity to night sensitivity can be effected by the controller based on the time of day. For this purpose, the controller expediently controls the control connections accordingly. The controller is implemented, for example, as a programmable microcontroller.

BRIEF DESCRIPTION OF THE DRAWINGS

Further advantages, features and advantages of the invention arise from the following description of the exemplary embodiments in connection with the Figures.

FIG. 5 shows, in FIG. 5A, the spectral sensitivity channels of a further exemplary embodiment of the detector arrangement, and in FIG. 5B, data for semiconductor layers of the semiconductor bodies for detector elements, whose spectral sensitivity distributions correspond to the respective sensitivity channels.

DETAILED DESCRIPTION

The same, similar, and elements of equivalent function are provided with the same reference numbers in the Figures. Furthermore, individual elements are not necessarily reproduced true to scale in the Figures. Rather, for increased clarity, individual elements can be illustrated in the Figures in exaggerated size.

Figure 1:
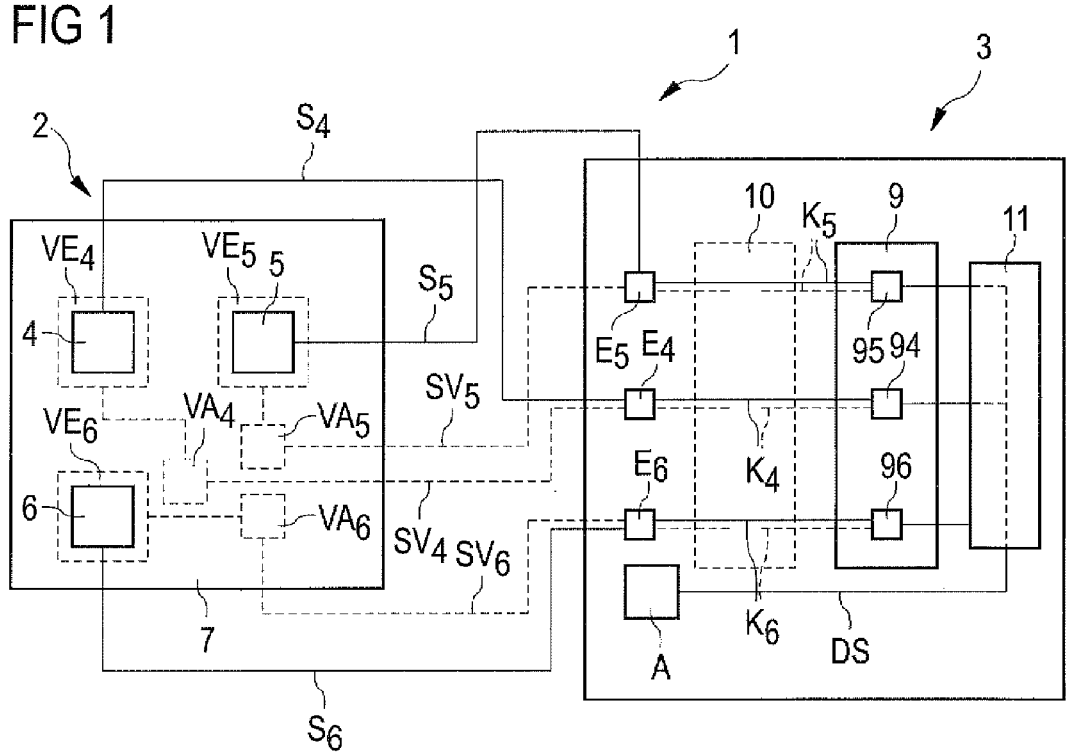
FIG. 1 shows a schematic representation of an exemplary embodiment of a radiation detector.

FIG. 1 shows a schematic representation of an exemplary embodiment of a radiation detector.

The radiation detector 1 comprises a detector arrangement 2 and a control device 3. The control device 3 is electrically connected to the detector arrangement 2, such that electrical signals generated in the detector arrangement 2 can be supplied to the control device.

The detector arrangement 2 comprises a plurality of detector elements 4, 5 and 6. The detector elements are expediently designed for receiving radiation and for generating signals. Preferably, a plurality of detector elements is implemented for detecting visible radiation. For example, three detector elements are provided that are designed for the detection of visible radiation. Preferably, different detector regions are assigned to the detector elements, for example, different colored spectral regions. Thus, the detector element 4 can be built for detection in the blue spectral region, the detector element 5 can be built for detection in the green spectral region, and the detector element 6 can be built for detection in the red spectral region.

A plurality of detector elements, preferably all detector elements, which are built for detecting visible radiation comprise a compound semiconductor material. III-V semiconductor materials from the $In_yAl_xGa_{1-x-y}P$ material system, with $0 \leq x \leq 1$ and $0 \leq y \leq 1$, preferably with $x \neq 0$, $y \neq 0$, $x \neq 1$ and/or $y \neq 1$, are particularly suited for the construction of a radiation detector for the visible spectral region due to their high attainable quantum efficiencies and their insensitivity in the infrared spectral region compared to Si. An external filter for filtering out an infrared component from the radiation to be detected can be eliminated in the detector arrangement because the detector elements themselves can already be built with a negligible or vanishing sensitivity in the infrared spectral region.

The detector elements 4, 5, and 6 are disposed on a common carrier 7, and preferably fixed on it. The carrier 7 can be built, for example, by means of a housing, in particular, a component housing, preferably a housing for a surface mountable component. Electrical connections for the detector elements are not explicitly represented, for reasons of clarity.

FIG. 2A shows a schematic sectional view of an exemplary embodiment of the detector arrangement 2. The detector elements 4, 5 and 6 are designed as discrete detector elements and are disposed alongside each other on the carrier 7. For example, the detector elements are implemented as discrete detector chips.

The detector elements 4, 5 and 6 each have a semiconductor body 401, 501 and 601, respectively. Preferably, the semiconductor body in each case comprises a plurality of semiconductor layers. Furthermore, the detector elements each have a radiation input side 402, 502 and 602, respectively. The radiation input side is facing away from the carrier 7.

The semiconductor body 401, 501 or 601 of the respective detector element comprises an active region 403, 503, or 603. The active region is disposed between two barrier layers 404 and 405, 504 and 505, and 604 and 605, respectively. The barrier layers between which the active region is disposed, preferably have different conducting types (p-conducting or n-conducting), and for this, are expediently suitably doped. The active region comprises a semiconductor functional layer which is preferably implemented un-doped.

The semiconductor body of the detector elements 4, 5, and 6 are each disposed on a substrate 406, 506, and 606, respectively. The substrate can be formed by means of the epitaxial substrate of the semiconductor layers for the semiconductor body on which the semiconductor layers are epitaxially grown.

Furthermore, the detector elements 4, 5, and 6 each have two electrical contacts 407 and 408, 507 and 508, and 607 and 608, respectively. The contacts 408, 508, and 608 can be disposed, for example, on the side of the substrate facing away from the respective semiconductor body. The contacts 407, 507, and 607 can be disposed on the side of the associated semiconductor body facing away from the respective substrate. The electrical contacts can be implemented as plating.

The electrical contacts are expediently electrically connected to the respective active region, so that charge carriers generated in the active region by absorption of components of a radiation 8 incident on the detector arrangement 2, can be conducted away from the respective detector element, and the signal so generated in the detector element can be detected. Furthermore, the signals of the individual detector elements can be detected independently of each other.

Preferably, each semiconductor body 401, 501, and 601, respectively, has a contact layer 409, 509 and 609, respectively. This means that the electrical connection of the semiconductor body to the electrical contact 407, 507 and 607, respectively, on the radiation input side, can be improved. The contact layer is preferably doped, for example, p-conducting.

The semiconductor layers of the respective semiconductor body are preferably based on compound semiconductor materials. III-V semiconductor materials are particularly suited for the visible spectral region. The active regions are preferably based on the $In_yAl_xGa_{1-x-y}P$ material system. By means of the Al content, the band gap of the functional layer, which comprises the respective active region and which forms the active region, can be set.

For the $In_yAl_xGa_{1-x-y}P$ material system, a GaAs substrate is particularly suited as an (epitaxial) substrate. With respect to good lattice matching to a GaAs substrate, it has proven advantageous to use materials from the $In_{0.5}(Ga_{1-x}Al_x)_{0.5}P$ sub-material system. GaP is particularly suited for the respective contact layer.

With increasing Al content, the band gap of a semiconductor layer increases for the active region. By selection of the Al content for the active region, in particular, the long wave cut-off wavelength of a spectral sensitivity distribution of the respective detector element can be set. Longer wavelength radiation, i.e., radiation whose wavelength is longer than that of the long wave cut-off wavelength, no longer generates a significant signal in the respective detector element. The long wave cut-off wavelength of the detector elements 4, 5 and 6 preferably lies, in each case, in the visible spectral region, wherein an external filter, for instance, for filtering infrared radiation, can be eliminated.

The table in FIG. 2B shows exemplary embodiments for materials of the semiconductor layers of the detector elements from FIG. 2A. Furthermore, the layer thicknesses, the respective band gap ($E_G$), the wavelength ($\lambda_G$) corresponding to this band gap, and the conducting type of the respective layers are given. The detector element 4 is built for detection of blue radiation, the detector element 5 is built for detection of green radiation, and the detector element 6 is built for the detection of red radiation.

Figure 2C:
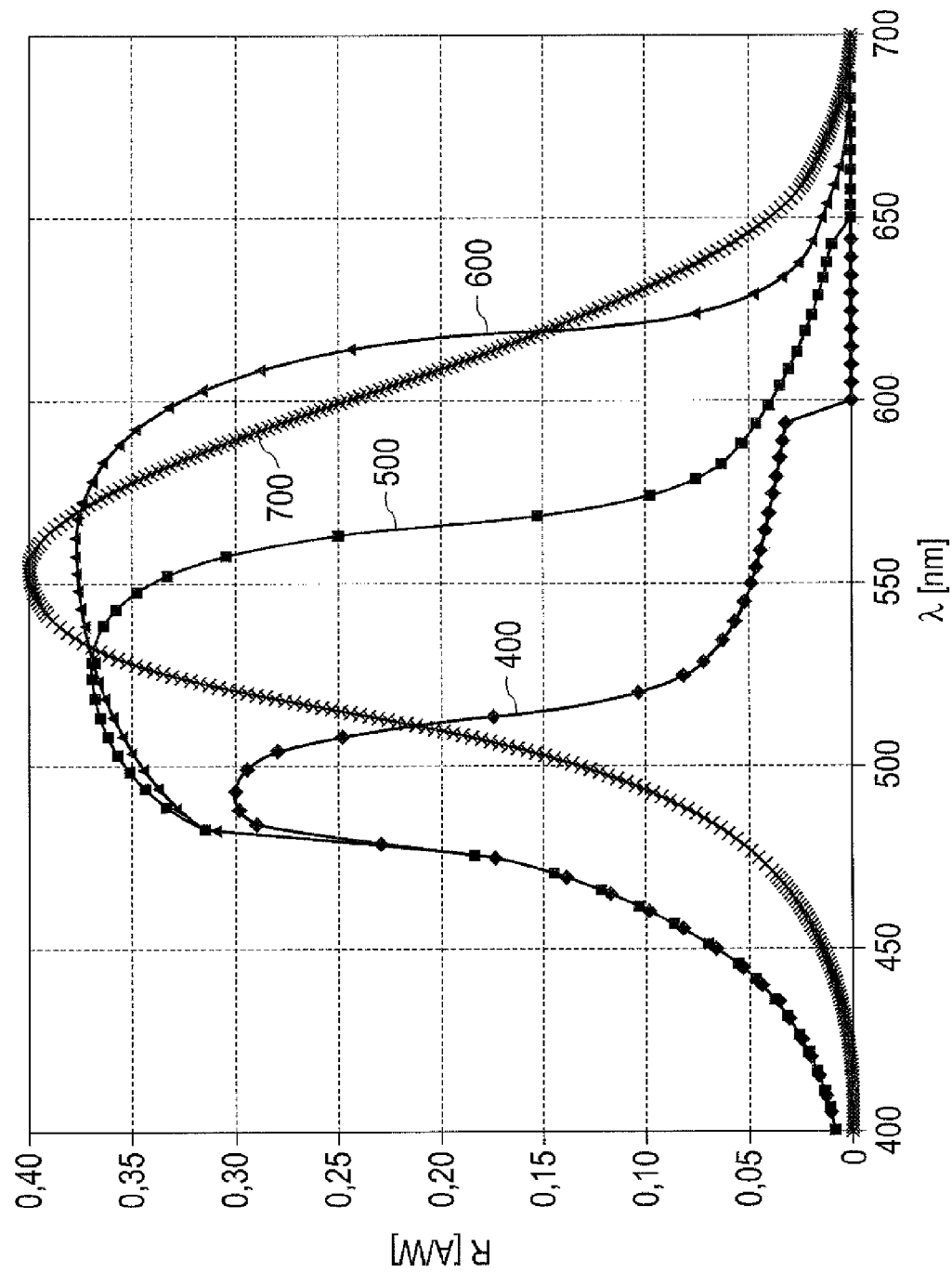
FIG. 2 shows, in FIG. 2A, a schematic sectional view of an exemplary embodiment of the detector arrangement, in FIG. 2B, data for the semiconductor bodies of the detector elements from FIG. 2A, in FIG. 2C, the spectral sensitivity distributions of the detector elements, and in FIG. 2D, the sensitivity channels of the radiation detector obtained from the sensitivity distributions.

FIG. 2C shows a simulation of the spectral sensitivity distribution of the detector elements 4, 5 and 6, where a construction of the semiconductor layers according to the table in FIG. 2B was assumed. The dependency of the responsivity R on the wavelength λ of the incident radiation in nanometers is represented. Here, the responsivity indicates the strength of the photocurrent generated in the respective detector element in amperes per Watt of incident radiation power.

The curve 600 depicts the spectral sensitivity distribution of the detector element 6, curve 500 depicts that of the detector element 5, and the curve 400 that of the detector element 4. Due to the low Al content, the detector element 6 is already sensitive in the red spectral region. The detector element 5, due to the larger Al content, shows high sensitivity values in the orange to green spectral range, and the detector element 4, due to the further increased Al content, is sensitive mainly in the blue spectral region.

The visible spectral region is illustrated by the sensitivity distribution of the light adapted human eye 700 according to the CIE (Commission Internationale de l'Eclairage [International Commission on Illumination]). All three detector elements show a significant sensitivity in the visible spectral region. Because, for example, in the blue spectral region, a significant signal is generated in all three detector elements, it is difficult to obtain color components from the incident radiation directly from the three detector element signals. In particular, the sensitivity distributions do not form distinct sensitivity channels; rather, they significantly overlap each other. Thus, for example, the distribution 600 completely covers the other two distributions.

Figure 3A:
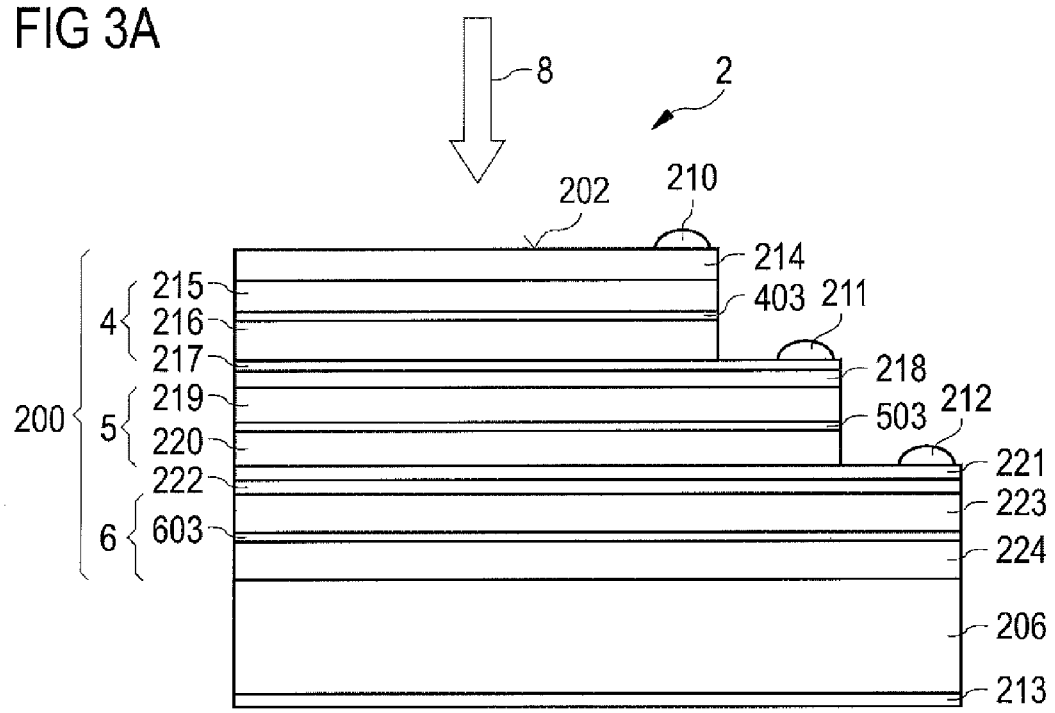
FIG. 3 shows, in FIG. 3A, a schematic sectional view of a further exemplary embodiment of the detector arrangement, in FIG. 3B, data for the layers of the semiconductor body from FIG. 3A, and in FIG. 3C, the sensitivity channels of the detector arrangement.

FIG. 3A shows a further exemplary embodiment of a detector arrangement 2 based on a schematic sectional view.

In contrast to the detector arrangement according to FIG. 2A, the detector elements 4, 5 and 6 are monolithically integrated in a common semiconductor body 200. The semiconductor body 200 therefore comprises the detector elements 4, 5 and 6. The semiconductor body 200 is disposed on a substrate 206, and can be grown epitaxially upon it. Further, the semiconductor body has a radiation input side 202. The detector elements 4, 5 and 6 are preferably disposed such that the band gap of the functional layer of the respective active region 403, 503, 603 decreases with increasing distance from the radiation input side 202. In contrast to the detector arrangement according to FIG. 2A with the discrete detector elements disposed alongside each other, such a monolithically integrated detector arrangement 2 with a plurality of detector elements grown epitaxially on each other, has a lower space requirement. However, the production cost for such a construction of the detector arrangement 2 is increased.

The signals generated in the detector elements 4, 5 and 6 can be captured independently of each other via the electrical contacts assigned to the detector elements. Here, the contacts 210 and 211 are assigned to the detector element 4, the contacts 211 and 212 to the detector element 5, and the contacts 212 and 213 to the detector element 6. The contacts assigned to the respective detector elements are electrically connected to the active region of the detector element. Two adjacent detector elements have, in each case, a common contact. The contacts can be implemented as plating.

Further, the semiconductor body 200 has a filter layer 214, which is monolithically integrated into the semiconductor body, and which can, in particular, be grown epitaxially. The filter layer 214 is preferably disposed on the radiation input side in the semiconductor body, and particularly preferably absorbs radiation in a wavelength region that comprises wavelengths shorter than the wavelength corresponding to the band gap of the active region, in particular, the band gap of the active region 403 disposed on the radiation input side. In the filtered wavelength region, a correspondingly reduced signal is generated in the active regions. The filter layer 214 serves as a window layer to the signal generating region of the detector arrangement.

Figure 3C:
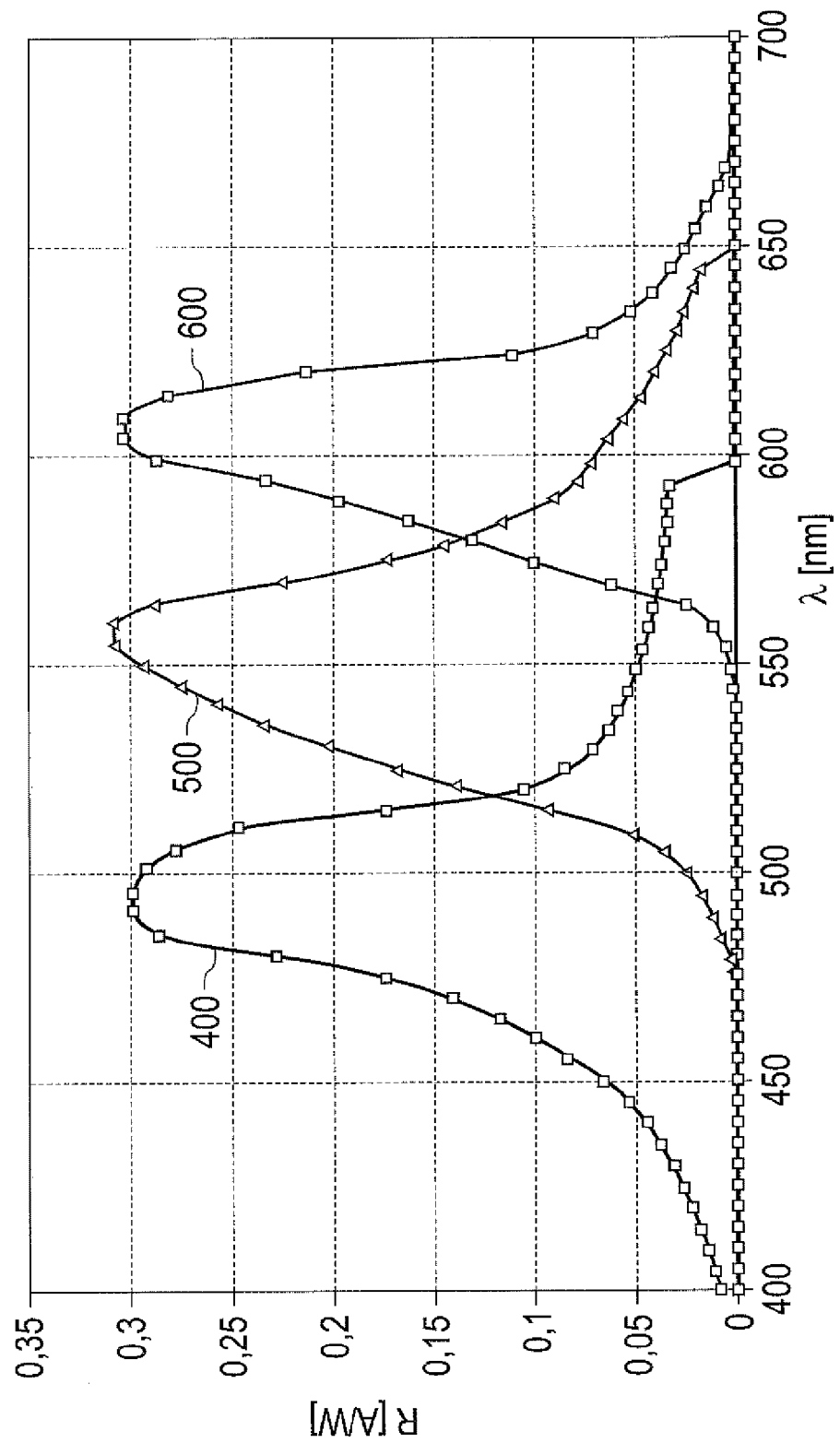

FIG. 3B shows a table that comprises data for the correspondingly designated layers in FIG. 3A; the data were the basis of the simulation for the spectral sensitivity distribution of the detector arrangement 2 (compare FIG. 3C).

The sensitivity distributions 400, 500 and 600 of the detector elements 4, 5 and 6 respectively, are represented in FIG. 3C. In contrast to the sensitivity distributions in FIG. 2C, sensitivity channels that are clearly spectrally separated, are already formed due to the sensitivity distributions of the detector elements. In particular, the sensitivity distributions overlap each other only partially. Obtaining information about color components in the incident radiation directly from the signals generated in the detector elements is thus simplified compared to the detector arrangement according to FIG. 2. However, the production costs are correspondingly higher.

Because a majority of the short wave radiation is already absorbed in detector element 4 on the radiation input side, it contributes to the signal generation in the downstream detector elements 5 and 6 only to a reduced extent. Therefore, the detector elements 5 and 6 generate a smaller signal in the short wave region than in the detector arrangement shown in FIG. 2A with a plurality of discrete detector elements disposed alongside each other. However, if necessary, by providing suitable filter layers, preferably based on (InGaAl)P or (Al)GaAs, the shortwave edge of the respective sensitivity distribution can also be suppressed for a distinct sensitivity channel in the discrete detector elements according to FIG. 2, by appropriate filtering of shortwave radiation. Appropriate filter layers are preferably disposed in the detector elements 5 and 6 for medium and longer wave radiation between the radiation input side and the active region of the respective semiconductor body.

If, corresponding to the illustration in FIG. 2A, no such filter layers are provided, then in order to obtain separate sensitivity channels with a sensitivity distribution according to FIG. 2C, the difference can be formed from two sensitivity channel distributions, for example.

Figure 2D:
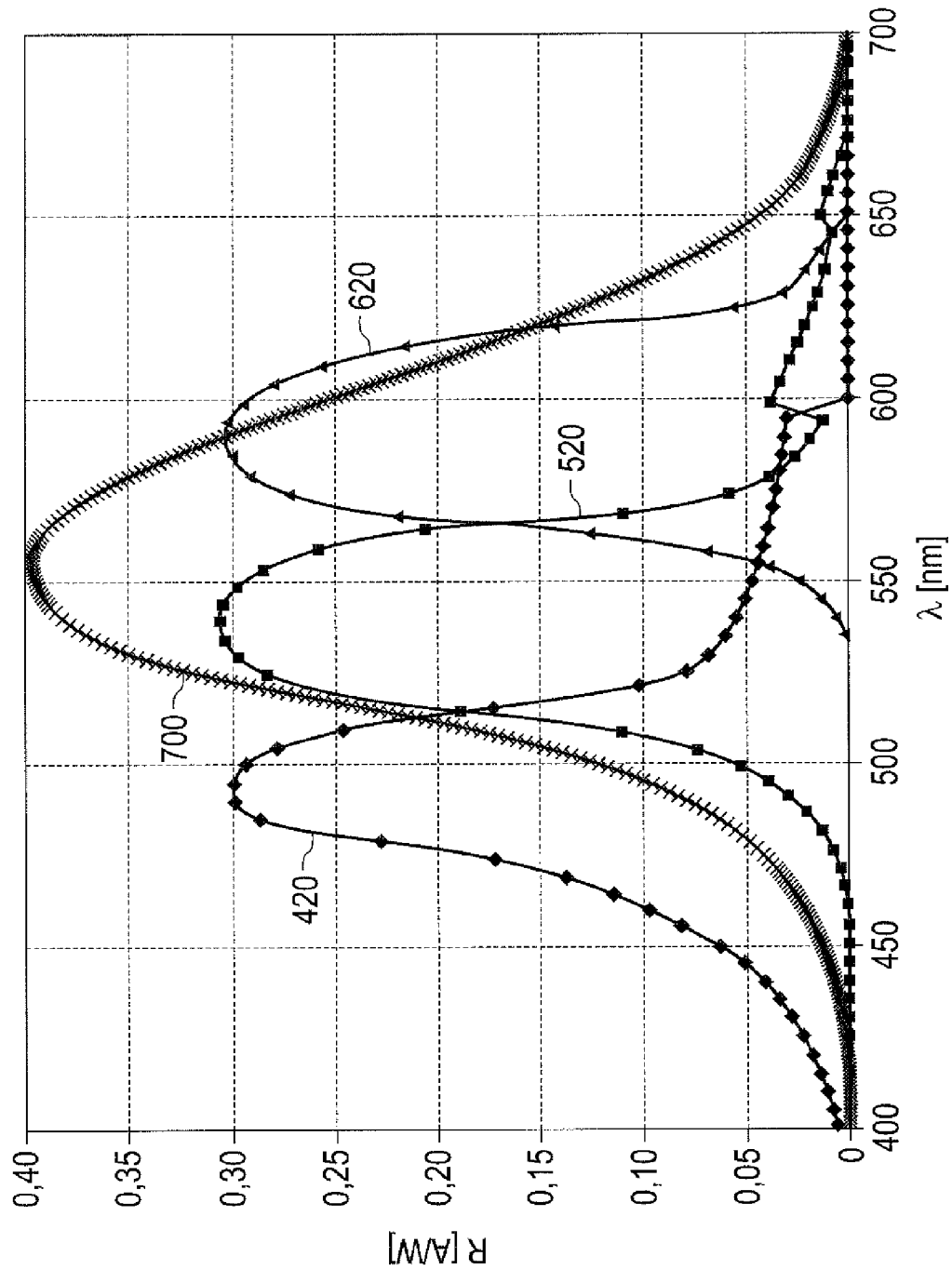

FIG. 2D shows the sensitivity channels obtained by forming such a difference, for color detection of the primary spectral colors red, green and blue. Further, the sensitivity distribution 700 of the light adapted human eye is also illustrated, in order to clearly indicate the visible spectral range.

The long wave sensitivity channel 620 is formed from the difference of the long wave sensitivity distributions 600 and the medium wave sensitivity distribution 500 according to FIG. 2C, the medium wave sensitivity channel 520 is formed by the difference of the medium and short wave sensitivity distributions 500 and 400. The short wave sensitivity channel 420 is formed by the spectral sensitivity distribution of the detector element 4, which is not modified.

In operation of the detector elements 4, 5 and 6 respectively—e.g., according to the exemplary embodiments according to the FIG. 2 or 3—signals generated in the detector elements can be supplied to the control device 3 (compare FIG. 1). Sensitivity channels can already be predefined through appropriate shaping of the spectral sensitivity distributions of the detector elements (compare, for example, FIG. 3C). Alternatively, signals that are not yet assigned to a preformed sensitivity channel, can be supplied to the control device (compare the wide distributions 500 and 600 from FIG. 2C).

The control device has a plurality of inputs (see the inputs $E_4$, $E_5$ and respectively $E_6$). Expediently, the signals $S_4$, $S_5$ and respectively $S_6$ generated in the detector elements are each supplied to a separate input of the control device. Before the signals are supplied to the control device, they can be preamplified. In this case, the carrier 7 is preferably implemented as a preamplifier, particularly preferably as an amplifier chip, for example based on silicon. Preferably in this case, one amplifier input $VE_4$, $VE_5$, and $VE_6$ is assigned to the detector elements 4, 5 and 6, respectively (see the elements, illustrated with dashed lines, of the carrier 7 in FIG. 1).

In the case of discrete detector elements, as described, for example, in connection with FIG. 2, the individual detector elements are preferably disposed in each case on a separate input of the amplifier chip, and are electrically connected to this input. An electrically conducting compound layer is particularly suited for this connection, for example a (silver) conducting adhesive layer.

A short connection path to the amplifier via a connection layer, for example, with a thickness of 1 µm or less, preferably 500 µm or less, is particularly suitable, because the signals usually generated in the detector elements are of low strength—for example, in the order of magnitude of nA or µA. The path, over which the noise prone "weak" signal is exposed to external electromagnetic noise, is advantageously kept short by a conducting layer connection.

The preamplified signal can be led, via outputs of the amplifier chip assigned to the respective detector elements, to the respective input of the control device 3 (compare the outputs $VA_4$, $VA_5$, and $VA_6$, as well as the preamplified signals $SV_4$, $SV_5$, and $SV_6$).

The variant in which the signals of the detector arrangement are preamplified, is indicated by the dashed lines up to the control device. Here, preferably exactly one amplifier input ($VE_i$, i=4, 5, 6) and/or amplifier output ($VA_i$, i=4, 5, 6) is assigned to each detector element.

The control device 3 has a control unit 9. The control unit 9 is preferably designed as an amplifier, in which channel signals $K_4$, $K_5$ and $K_6$ from the different sensitivity channels can be amplified, respectively with different amplification factors. The control unit 9 has control connections 94, 95, and 96, via which the amplification factors for the channel signals from the sensitivity channels can be adjusted independently of each other.

If the detector arrangement does not yet have predefined sensitivity channels (compare FIG. 2C), the control unit can be built such that the signals generated in the detector elements can be processed in the control device 3 in such a way that channel signals are formed, which are assigned to a sensitivity channel. The sensitivity channels are preferably formed in the control device by an element of this device before the signals are led to the control unit.

For example, a difference generating unit 10 can be provided in the control device, that forms differences from the signals obtained from the detector arrangement, by which process the channel signals are formed (see FIG. 2D).

In the control unit 9, the weightings of the channel signals relative to one another can be adjusted independently.

The differently weighted channel signals can subsequently be superposed in the superposition unit 11 of the control device 3. Preferably, the superposing unit 11 adds the differently weighted channel signals after their passage through the control unit 9. This is indicated by the dashed lines in the superposition unit.

The differently weighted channel signals are superposed in the superposition unit 11 to form the detector signal DS of the radiation detector, in particular, they are added together. This detector signal DS can be captured at an output A of the control device 3, which is electrically connected to the superposing unit 11.

The control device 3 is advantageously designed as an integrated circuit, preferably based on Si. This means that a small and compact design of the radiation detector 1 can be more simply obtained.

By the superposition of differently weighted channel signals, a radiation detector with different sensitivity distributions—the dependency of the output signal DS at the output A on the wavelength—can be realized.

For example, a radiation detector can be constructed as an ambient light detector which has a sensitivity distribution according to that of the human eye, by differential weighting of the channel signals by means of the control unit 9. This is illustrated for the sensitivity channels according to FIG. 2D in the FIGS. 4A and 4B.

Figure 4A:
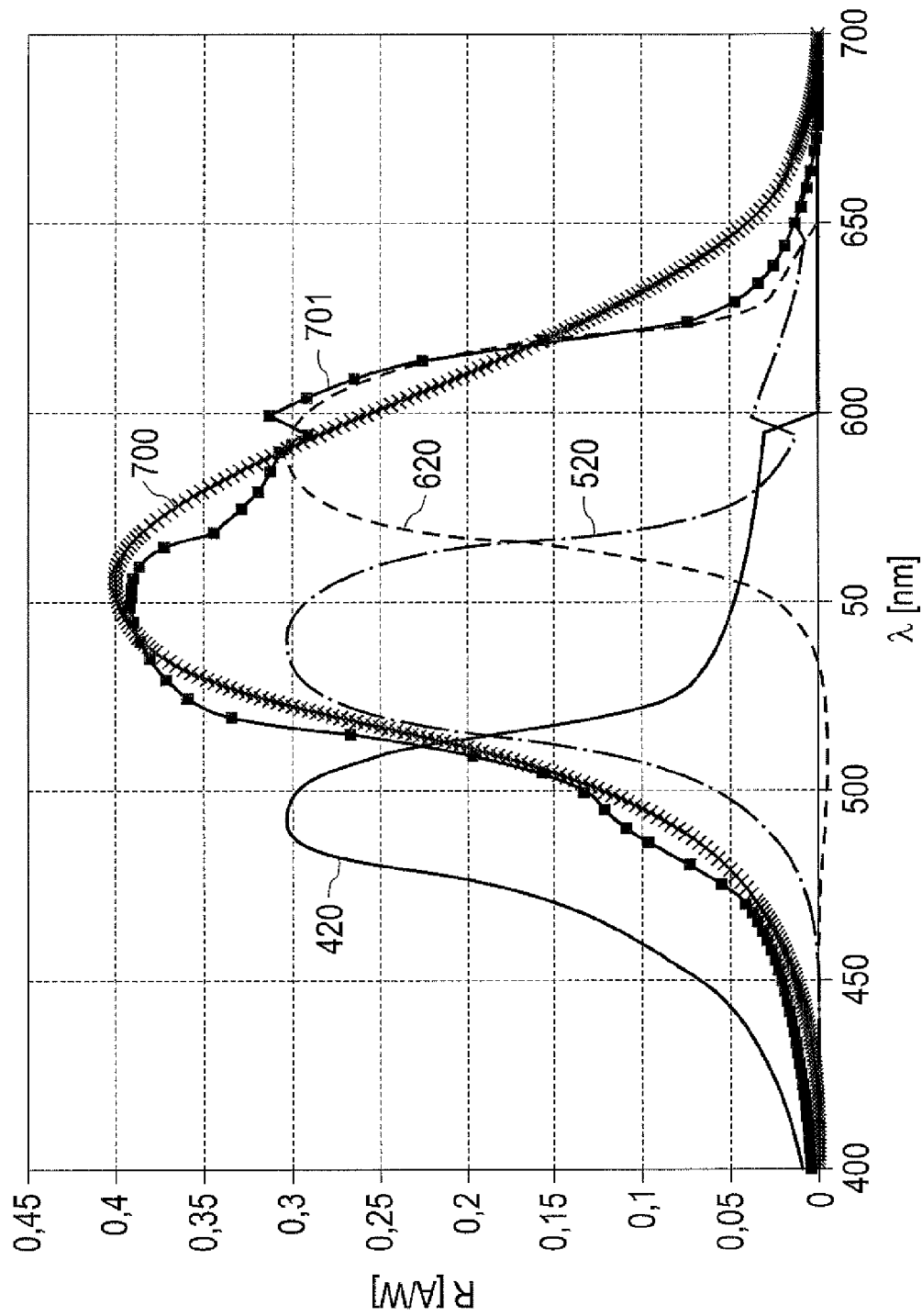
FIG. 4 shows the superimposed sensitivity channels according to FIG. 2D for the spectral sensitivity distribution of the light adapted human eye, in FIG. 4A, and in FIG. 4B, those for the spectral sensitivity distribution of the darkness adapted human eye.

In FIG. 4A, the sensitivity channels are superposed for a sensitivity distribution according to that of the light adapted human eye. For this purpose, signals from the individual sensitivity channels are attenuated or amplified relative to each other. The illustrated superposed sensitivity distribution 701 results from an amplification of the sensitivity channel 620 by the factor 0.9, the sensitivity channel 520 by the factor 1.2, and the sensitivity channel 420 by the factor 0.25. The summed sensitivity distribution 701 corresponds essentially to that of the light adapted human eye 700.

Figure 4B:
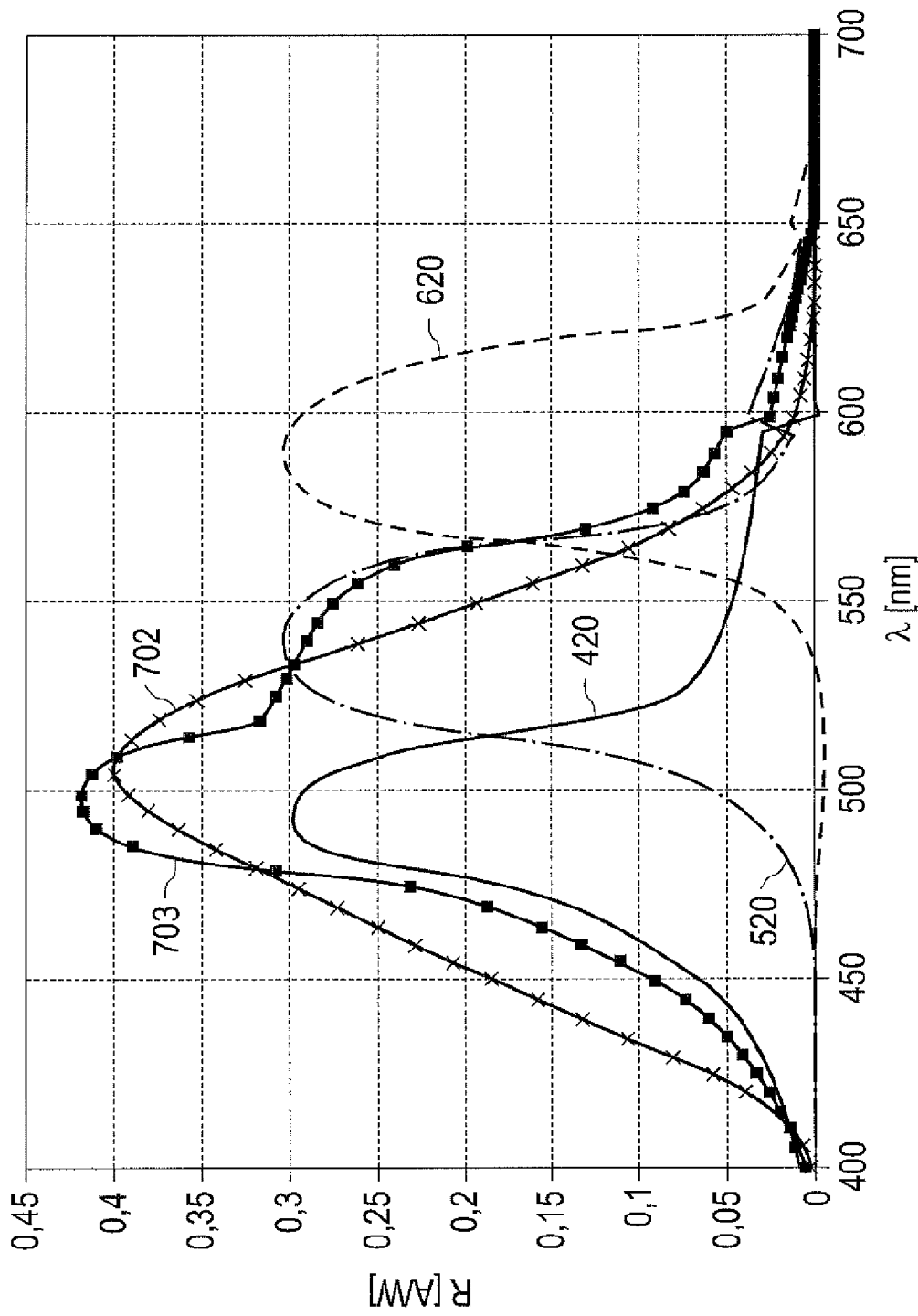

In FIG. 4B, the long wave sensitivity channel 620, which is assigned to the red spectral region, is suppressed, which corresponds to an amplification factor of 0. The sensitivity channel 520, which is assigned to the green spectral region, is amplified with a factor of 0.7, and the sensitivity channel 420, which is assigned to the blue spectral region, is amplified with a factor of 1.3. The summed distribution 703 corresponds approximately to that of the dark adapted human eye 702. For the distribution of the dark adapted human eye, the corresponding distribution according to International Commission on Illumination (CIE) from 1931 can be referenced.

Preferably, the spectral distribution of the detector sensitivity can be switched via the control connections 94, 95 and 96 between that of the light adapted human eye (distribution 700, FIG. 4A) and that of the dark adapted human eye (distribution 702, FIG. 4B). The switching procedure can be controlled, for example, by means of a light/dark sensor (not explicitly illustrated), which is preferably part of the radiation detector. Also, the sensitivity channels of the monolithic detector arrangement (compare FIG. 3) can be correspondingly differentially weighted and can be superposed for the desired distribution.

Along with the possibility of operating the radiation detector 1 as an ambient light sensor, it can naturally also be used as a color sensor for detecting the primary colors corresponding to the sensitivity channels—which in the exemplary embodiments are the primary colors red, green and blue. Using the detector signal, the color components in the radiation incident on the radiation detector can then be determined. From these color components, e.g., the chromaticity coordinate or the color impression of the incident radiation can be detected. Signal contributions from the sensitivity channels that are not assigned to the color to be detected can be suppressed for this purpose by appropriate setting of the control connections.

Furthermore, a predefined sensitivity distribution of the radiation detector can be adjusted via appropriate control at the control connections. The radiation detector has a space saving construction overall, and can advantageously be used for various applications.

FIG. 5A shows the spectral sensitivity distribution of a detector arrangement with a plurality of separate spectral sensitivity channels 801 . . . 809. Here, the sensitivity channels are formed by the spectral sensitivity distributions of corresponding detector elements. For this purpose, the detector elements have appropriate filter layers, which are disposed between the radiation input side and the active region of the respective semiconductor body. For example, 9 detector elements, analogous to the illustration in FIG. 2A, can be disposed alongside each other, a filter layer being provided between the radiation input side and the respective active region in addition to the layer structure shown in FIG. 2A.

Here, data corresponding to the table in FIG. 5B was used for the sensitivity distribution of the detector elements.

The active regions are based, in each case, on the $In_yAl_xGa_{1-x-y}P$ material system. The filter layer, in each case, is either based on the same material system, or consists of GaP.

The spectral sensitivity distributions of the detector elements each have a maximum at a wavelength λmax in the visible spectral region.

Furthermore, the individual sensitivity channels are implemented as narrow band channels, and in particular, at least in part have spectral widths of 60 nm or less, preferably of 40 nm or less, particularly preferably of 30 nm or less, or even of 20 nm or less.

This multiplicity of sensitivity channels facilitates, owing to the finer partitioning of channels over the visible spectral region, the exact reproduction of a predefined sensitivity distribution on the one hand, and also the detection of specific spectral lines on the other, for example for the authentification of bank cards or monetary bills.

For detecting specific spectral lines, the sensitivity channels that are not necessary for the detection of this spectral line are expediently suppressed.

Furthermore, the spectral sensitivity distribution 702 of the dark adapted human eye is illustrated in FIG. 5A. A sensitivity distribution 703, summed up with the amplification factors for the individual sensitivity channels from the Table in FIG. 5B, has a shape that very closely corresponds to that of the dark adapted human eye 702.

The illustrated channels 801 . . . 809 are also suited for color detection, wherein color information is preferably obtained from a plurality of channel signals.

Preferably the setting of the operating state of the radiation detector—as a color sensor, an ambient light sensor for the light adapted eye, an ambient light sensor for the dark adapted eye, or if applicable as a spectral line sensor—is programmably controlled, e.g., via a programmable microcontroller. The microcontroller is expediently electrically connected to the control connections 94, 95, 96 of the control device 9.

Figure 6:
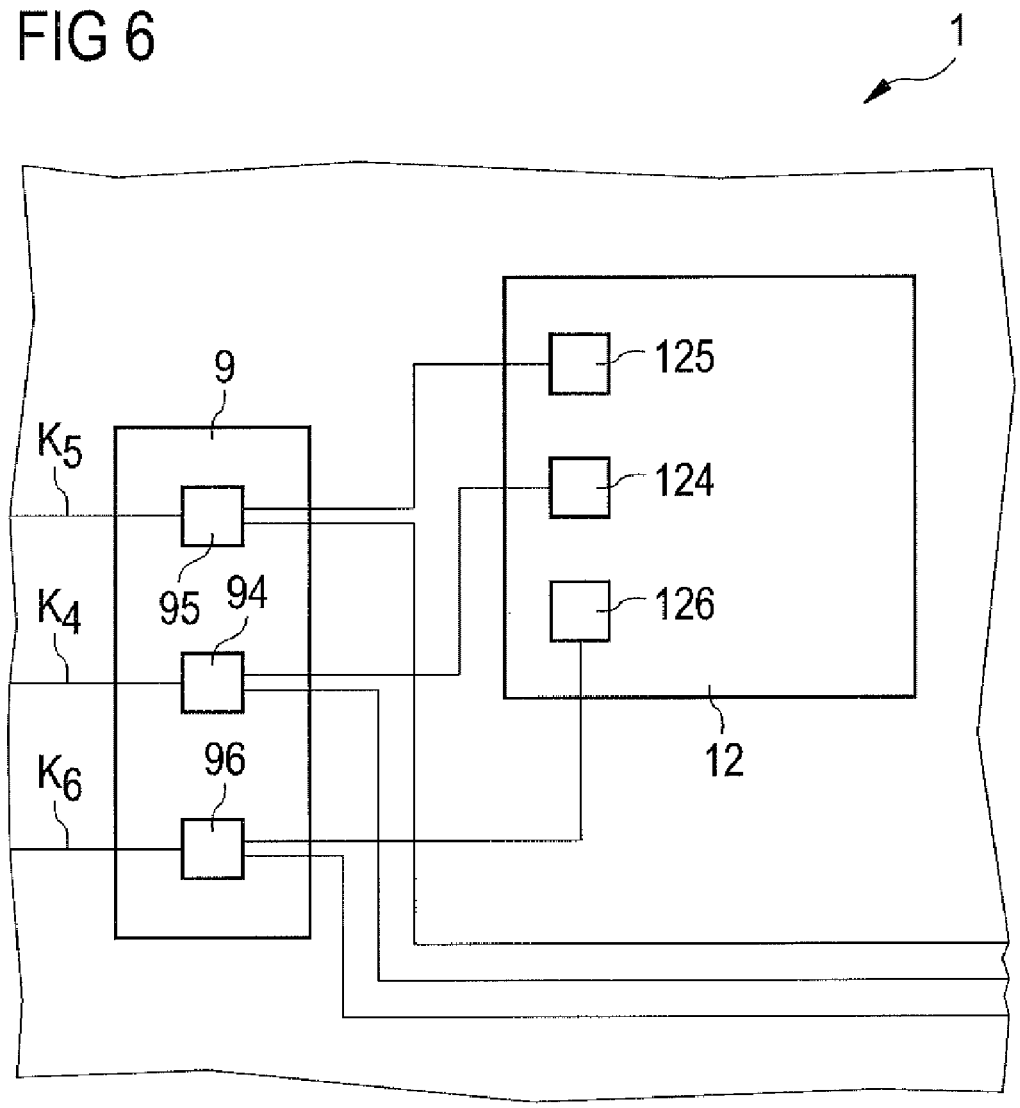
FIG. 6 shows a detail of a further exemplary embodiment of a radiation detector.

FIG. 6 shows a partial view of the radiation detector 1 according to FIG. 1, in which, in addition to the radiation detector according to FIG. 1, one such microcontroller 12 is electrically connected to the control connections 94, 95, 96 of the control device 9. The other elements of the radiation detector that are illustrated in FIG. 1, are not explicitly illustrated in FIG. 6 for reasons of clarity, but can naturally be provided. The control connections can be expediently controlled independently of each other by means of the microcontroller 12. For example, the control connections 94, 95 and 96 are, in each case, electrically connected to a separate electrical contact 124, 125, and 126, respectively, of the microcontroller 12.

The microcontroller 12 is preferably programmed such that it controls the control connections according to fixed predefined operating states of the radiation detector, e.g., as a color sensor, as an ambient light sensor for the light adapted eye, as an ambient light sensor for the dark adapted eye, or as a spectral line sensor. A user can then freely switch between the predefined operating states by appropriately addressing the microcontroller. Thus, a time-consuming determination by the user of the relative settings for the control connections best suited to the respective operating state can be avoided. Rather, these settings can be implemented in advance by appropriate programming of the microcontroller at the factory.

Alternatively or in addition, the microcontroller can control the operating state temporally, e.g., with respect to the time of day. For example, the microcontroller can be programmed such that from a specific time of day, preferably after dusk, in the case of the operation of the radiation detector as an ambient light sensor, it only permits detection according to the dark adapted human eye. Preferably, the microcontroller can be programmed by the user so that a switchover between operating states of the radiation detector, in particular, a time-controlled switchover, can be preset by the user.

The invention is not limited by the description based on the exemplary embodiments. Rather, the invention comprises each new feature, as well as any combination of features, which includes in particular every combination of features in the patent claims, even if this feature or this combination itself is not explicitly specified in the patent claims or exemplary embodiments.

The invention claimed is:

1. A radiation detector comprising:
   a plurality of detector elements, by means of which, during operation of the radiation detector, a detector signal is obtained; and
   a control device;
   wherein:
   the detector elements each have a spectral sensitivity distribution and are suitable for generating signals,
   at least one detector element comprises a compound semiconductor material, said detector element being designed for detecting radiation in the visible spectral region,
   the radiation detector is designed such that different spectral sensitivity channels of the radiation detector are formed by means of the spectral sensitivity distribution of the detector elements,
   in the spectral sensitivity channels, a channel signal assigned to a respective sensitivity channel, can be generated using the detector elements,
   the control device is designed such that contributions of different channel signals to the detector signal of the radiation detector can be controlled differently,
   wherein the control device weights contributions of channel signals to the detector signal differently relative to each other, and
   wherein the detector signal of the radiation detector is formed by means of superposition of channel signals.

2. The radiation detector according to claim 1, wherein the control device has a plurality of inputs, via which signals generated in the detector elements are supplied to the control device, and different inputs are assigned different detector elements.

3. The radiation detector according to claim 1, wherein the control device has a plurality of control connections, by means of which the contributions of the different channel signals to the detector signal can be controlled.

4. The radiation detector according to claim 1, wherein an individual channel signal is obtained by means of two signals generated in different detector elements.

5. The radiation detector according to claim 4, wherein a channel signal is obtained by forming a difference of the two signals generated in different detector elements.

6. The radiation detector according to claim 1, wherein sensitivity channels spectrally overlap.

7. The radiation detector according to claim 1, wherein the different spectral sensitivity channels overlap in such a way that the visible spectral region is covered.

8. The radiation detector according to claim 1, wherein the control device is designed such that the radiation detector can be operated as an ambient light sensor with a spectral distribution of detector sensitivity corresponding to that of a human eye.

9. The radiation detector according to claim 8, wherein the spectral distribution of the detector sensitivity can be switched between that of a light adapted human eye and a dark adapted human eye using the control device.

10. The radiation detector according to claim 1, wherein the radiation detector can be operated as a color sensor, for detecting three basic colors.

11. The radiation detector according to claim 1, wherein the radiation detector can be operated by means of the control device both as an ambient light sensor and as a color sensor.

12. The radiation detector according to claim 1, wherein the plurality of detector elements comprise an epitaxially grown semiconductor body that comprises at least one of the detector elements.

13. The radiation detector according to claim 12, wherein the at least one detector element has an active region serving the signal generation, which comprises the compound semiconductor material.

14. The radiation detector according to claim 12, wherein the plurality of detector elements is monolithically integrated into a common semiconductor body.

15. The radiation detector according to claim 1, wherein the plurality of detector elements comprises a plurality of separate detector elements disposed next to each other.

16. The radiation detector according to claim 1, wherein the plurality of detector elements comprises the compound semiconductor material.

17. The radiation detector according to claim 1, wherein the plurality of detector elements is constructed for detecting radiation in the visible spectral range.

18. The radiation detector according to claim 1, wherein the radiation detector has three or more, sensitivity channels.

19. The radiation detector according to claim 1, wherein the radiation detector has one or more narrow band sensitivity channels.

20. The radiation detector according to claim 1, wherein the compound semiconductor material is a III-V semiconductor material.

21. The radiation detector according to claim 1, wherein the control device is implemented as an integrated circuit.

22. The radiation detector according to claim 20, wherein the compound semiconductor material comprises a compound semiconductor material from a (In,Al,Ga)P material system.

* * * * *